(12) United States Patent
He et al.

(10) Patent No.: US 11,586,913 B2
(45) Date of Patent: Feb. 21, 2023

(54) POWER EQUIPMENT FAULT DETECTING AND POSITIONING METHOD OF ARTIFICIAL INTELLIGENCE INFERENCE FUSION

(71) Applicant: WUHAN UNIVERSITY, Hubei (CN)

(72) Inventors: Yigang He, Hubei (CN); Jiajun Duan, Hubei (CN); Hui Zhang, Hubei (CN); Liulu He, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 614 days.

(21) Appl. No.: 16/726,279

(22) Filed: Dec. 24, 2019

(65) Prior Publication Data
US 2020/0387785 A1  Dec. 10, 2020

(30) Foreign Application Priority Data
Jun. 5, 2019 (CN) .......................... 201910486614.8

(51) Int. Cl.
| | | |
|---|---|---|
| *G06N 3/08* | (2006.01) | |
| *G06F 1/3206* | (2019.01) | |
| *G06N 5/04* | (2006.01) | |
| *H02J 3/00* | (2006.01) | |
| *G06K 9/62* | (2022.01) | |
| *H02J 13/00* | (2006.01) | |
| *G01R 31/08* | (2020.01) | |

(52) U.S. Cl.
CPC .............. *G06N 3/08* (2013.01); *G01R 31/08* (2013.01); *G06F 1/3206* (2013.01); *G06K 9/6232* (2013.01); *G06K 9/6259* (2013.01); *G06K 9/6267* (2013.01); *G06K 9/6288* (2013.01); *G06N 5/04* (2013.01); *H02J 3/0012* (2020.01); *H02J 13/00002* (2020.01)

(58) Field of Classification Search
CPC .... G01R 31/08; G06F 1/3206; G06K 9/6288; G06N 5/04
See application file for complete search history.

(56) References Cited

U.S. PATENT DOCUMENTS

2018/0284737 A1* 10/2018 Cella .................. G05B 19/4183

* cited by examiner

*Primary Examiner* — Manuel A Rivera Vargas
(74) *Attorney, Agent, or Firm* — JCIPRNET

(57) ABSTRACT

A method includes steps: 1) obtaining monitoring information of different monitoring points in normal state of power equipment; 2) setting faults and obtaining monitoring information of different fault types, positions, monitoring points of the equipment; 3) taking the monitoring information obtained in steps 1) to 2) as training dataset, taking the fault types and positions as labels, inputting the training dataset and the labels to deep CNN for training; 4) collecting monitoring data, performing verification and classification using step 3), obtaining probability values corresponding to each of the labels; 5) taking classification results of different labels as basic probability assignment values, with respect to a monitoring system composed of multiple sensors, taking different sensors as different evidences for decision fusion, performing fusion processing using the DS evidence theory to obtain fault diagnosis result. The invention can intelligently realize fault detection, fault type determination, and fault positioning of the power equipment.

9 Claims, 4 Drawing Sheets

(a) monitoring point 1   (b) monitoring point 2   (c) monitoring point 3

POWER EQUIPMENT FAULT DETECTING AND POSITIONING METHOD OF ARTIFICIAL INTELLIGENCE INFERENCE FUSION

CROSS-REFERENCE TO RELATED APPLICATION

This application claims the priority benefit of China application serial no. 201910486614.8, filed on Jun. 5, 2019. The entirety of the above-mentioned patent application is hereby incorporated by reference herein and made a part of this specification.

BACKGROUND OF THE INVENTION

Field of the Invention

The disclosure relates to a power equipment fault detecting and positioning method of artificial intelligence inference fusion, and more particularly, to a power equipment fault diagnosis method combining the deep convolutional neural network and the multi-source information fusion theory.

Description of Related Art

With the advent of the Industry 4.0 era, the equipment will continue to develop toward intelligence and integration in the future. The connection among industrial equipment is becoming closer and closer, and a fault of any important parts may lead to breakdown of the entire system. Therefore, it is necessary to thoroughly research an intelligent fault diagnosis method. The conventional monitoring diagnosis methods exhibit poor robustness and can hardly satisfy the characteristics of a large capacity, multi-source heterogeneity, and a high acquisition frequency of the intelligent monitoring system data. Moreover, diagnosis techniques such as fuzzy diagnosis, the expert system, and the support vector machine are overdependent on manmade parameter feature setting and are thus less efficient in the environment where the monitoring items are complex. Being an artificial intelligence science that has developed rapidly in recent years, deep learning can meet the diagnostic analysis demands of the high-dimensional and nonlinear diversified data in complex backgrounds and is one of the important development directions of fault diagnosis in the future.

At present, the research on power equipment fault diagnosis by using the deep learning method is still in its infancy. Having great advantages in the field of image processing, the deep learning method can extract deep image information, provides possibilities for further accurate diagnosis, and is widely applied to the detection fields of moving target positioning and face reference point positioning. Mandi Khanali et al. proposed that the short-circuit fault position inside the transformer winding may be manually set, and by analyzing the influence pattern of each fault occurring position on the frequency response curve, the fault classification of the monitoring curve is realized. Dey et al. proposed classifying fault modes of the transformer pulse by using the deep learning framework, which can realize a very high classification accuracy. However, none of the above methods considers the fault position information, and the research on the deep learning positioning method as applied to the power equipment fault diagnosis is almost still blank. In addition, in the actual monitoring system, with respect to a piece of equipment, the monitoring nodes are widely distributed and there are many data types, so the premise of fault positioning must involve fusion-processing information of multiple monitoring nodes. Therefore, it is necessary to research a deep learning fault diagnosis method that can integrate multi-source heterogeneous data of multiple monitoring nodes.

SUMMARY OF THE INVENTION

The objective of the invention is to provide a power equipment fault detecting and positioning method based on deep learning and multi-source information fusion.

The technical solution adopted in the invention is:

providing a power equipment fault detecting and positioning method of artificial intelligence inference fusion, including steps of:

1) setting state detection points of power equipment and obtaining monitoring data of different monitoring points in a normal operating state of the power equipment;

2) setting fault types, fault positions, and fault severities of the power equipment, and obtaining monitoring information of the different monitoring points;

3) taking the obtained monitoring information as a training dataset and taking the fault types and the fault positions as labels, and inputting the training dataset and the labels to a deep convolutional neural network for training to obtain a trained power equipment fault detecting neural network;

4) performing verification and classification by using the power equipment fault detecting neural network, and obtaining supports corresponding to each of the labels; and 5) taking the supports corresponding to different labels as basic probability assignment values, taking different sensors as different evidences for decision fusion, performing fusion processing by using a multi-source information fusion method, and obtaining a final fault diagnosis result.

Further to the above technical solution, step 2) specifically includes steps of: first, dividing fault regions according to characteristics of equipment to be monitored and setting the fault types and the fault positions; with respect to the same one fault region and fault type, setting different fault levels according to a fault severity distribution of actual application; and then, performing cyclic simulation, traversing different fault regions, fault types, and fault levels, and obtaining detailed fault simulation information.

Further to the above technical solution, in steps 1) to 2), a method of obtaining the monitoring information of the power equipment includes online monitoring, offline monitoring, and dynamic or static simulation analysis; when a fault of a fault region i and a fault type j is set, a severity of the fault is randomly determined according to a probability distribution of a fault level in actual operation of the equipment; and for certain equipment in which it is difficult to set the fault or a probability of fault occurrence is extremely low, dynamic or static simulation results are used to replace the monitoring data and historical detection records.

Further to the above technical solution, the network used for training in step 3) is a deep convolutional neural network and processes the monitoring information through image formation, wherein monitoring fault type j and fault region i are written in combination as "ji" which serves as a corresponding label $H\gamma$, and the label in the normal state is written as "00": $H_\gamma = \{00, 11, 12, \ldots, ji\}$, $\gamma = 1, 2, \ldots, l$, where l is a total number of the labels;

a time sequence of discrete value monitoring data is taken as a matrix column, and a matrix row is filled with the same values to form a square matrix, and a monitoring amplitude is uniformly converted into color representation according to a color index and the square matrix is placed into a dataset to be trained; in the case of image-type monitoring data, the color index is directly unified and then the monitoring data is placed as a monitoring image into the dataset to be trained; and an image size of the dataset is unified, and the dataset is taken as an input dataset of the deep convolutional neural network for training.

Further to the above technical solution, operations of adding noise, cutting/transformation, rotation, mirroring, grayscale, etc. are randomly performed on a monitoring image dataset to expand the dataset to be trained.

Further to the above technical solution, in a method of performing fault diagnosis by using the convolutional neural network in step 3): a feature map output by a last one pooling layer is taken as an input of a fully connected layer; "(fault type n)×(fault position m)+2 (normal state, indeterminate state)" is replaced with a total output number of the fully connected layer; and the label "ji" of a different fault category means different fault type j and fault region i, and by identifying a classification of the labels, preliminary type detection and positioning of the fault is realized.

Further to the above technical solution, label supports obtained in step 4) are probability values of an input dataset belonging to the different labels and are classified and obtained by the trained network.

Further to the above technical solution, an information fusion diagnosis method of a multi-sensor monitoring system in step 5) includes: obtaining supports of each of the monitoring points for all of the labels based on an output result of performing fault diagnosis by the CNN; and fusing support information of each of the monitoring points through the multi-source information fusion method to obtain a final support for the labels.

Further to the above technical solution, the multi-source information fusion method in step 5) includes: a weighted average, a method based on a probability theory or a statistical model theory, and a rule-based inference method. The advantageous effect achieved in the invention is: The invention can realize fault identification and positioning through the power equipment fault detecting and positioning method of artificial intelligence inference fusion. Through multi-sensor monitoring information fusion, the accuracy is higher than that of a unitary deep learning diagnosis method.

The invention labels the fault types and the fault positions and converts a positioning issue into a classification issue, which is not only convenient for fault diagnosis through the deep learning classification method, but can also be processed as a recognition framework in the multi-source information fusion theory. Through deep learning, the supports of information of each monitoring point for the fault feature are obtained, and multiple pieces of support information are fused by using the evidence theory to obtain the final diagnosis result.

BRIEF DESCRIPTION OF THE DRAWINGS

The invention will be further described below with reference to the accompanying drawings and embodiments. The accompanying drawings are as follows.

DESCRIPTION OF THE EMBODIMENTS

To provide a further understanding of the purposes, technical solutions, and advantages of the invention, the invention will be further described in detail below with reference to the accompanying drawings and embodiments. It is understood that the specific embodiments described herein are merely meant to illustrate, rather than limit, the invention.

Figure 1:
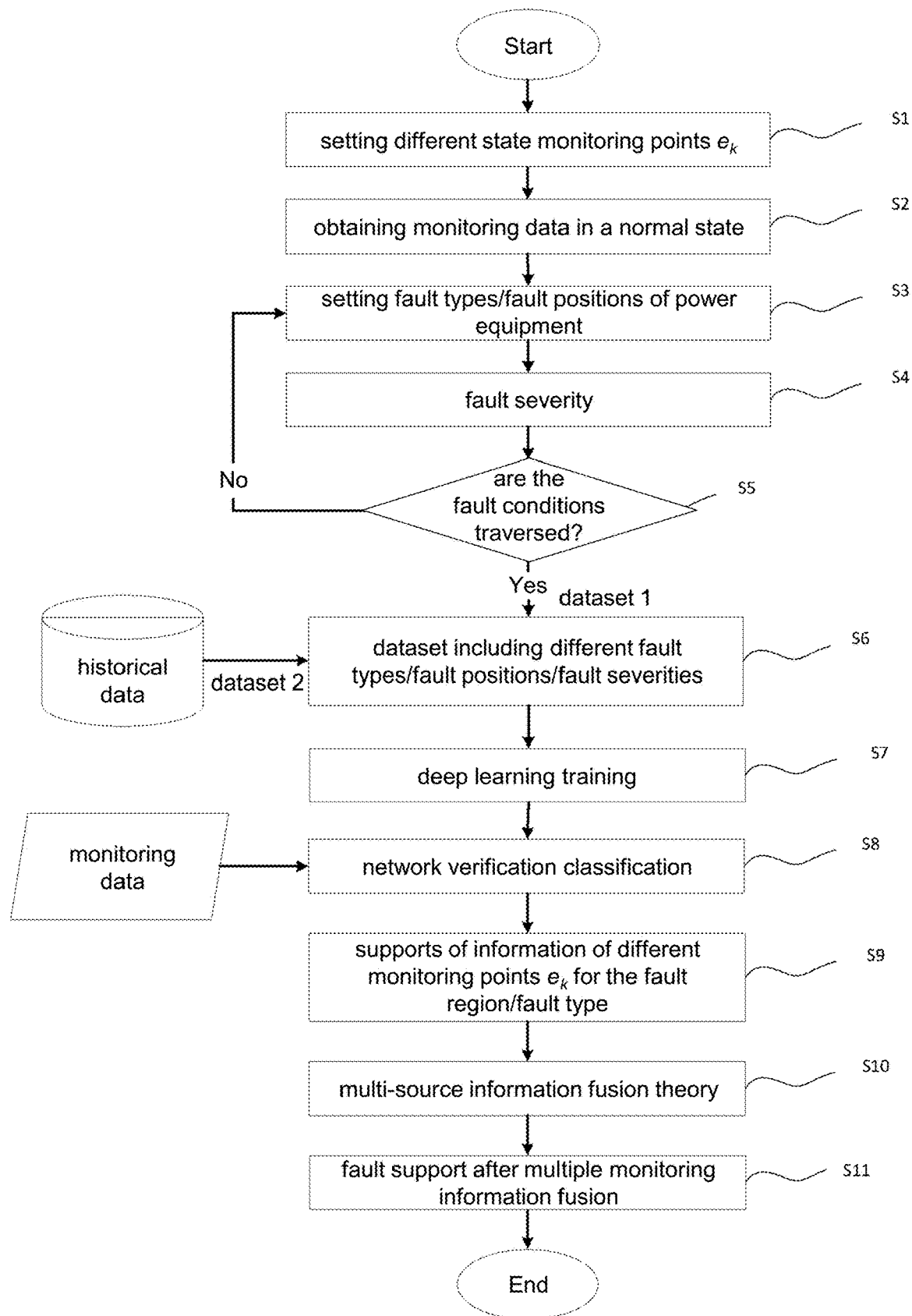
FIG. 1 is a flowchart of a technical solution of a power equipment fault detecting and positioning method based on artificial intelligence inference fusion according to the invention.

As shown in FIG. 1, a power equipment fault detecting and positioning method of artificial intelligence inference fusion according to the present embodiment specifically includes the following steps:

S1: setting state monitoring points $e_k$ of the power equipment;

S2: obtaining monitoring data of different monitoring points in a normal operating state of the power equipment;

S3: setting fault types and fault positions of the power equipment, and obtaining monitoring information of the different monitoring points;

S4: setting a range of fault severity according to actual requirements to determine an interval of fault simulation;

S5: determining whether the fault types/fault positions/fault severities are traversed; if not, returning to S3; if yes, taking all simulation data as a dataset 1, and entering the next step;

S6: taking historical monitoring and diagnostic data of the power equipment to be tested as a dataset 2, and merging the dataset 2 with the simulation dataset 1 to form a training dataset;

S7: inputting the training dataset to a deep learning framework (convolutional neural network) for training;

S8: diagnosing the monitoring data by using the trained network;

S9: obtaining supports of information of different monitoring points $e_k$ for the fault position/fault type;

S10: fusing the supports of multiple monitoring points by using the multi-source information fusion theory; and S11: obtaining a total fault diagnosis support, i.e., a diagnosis result.

In steps S3 to S4, setting different fault types, fault positions, and fault severities and obtaining information of different monitoring points include the following steps: first, dividing fault regions and setting the fault types and fault locations according to the characteristics of the equipment to be monitored; with respect to the same one fault region and fault type, setting different fault levels according to the fault severity distribution of actual application; and then, performing cyclic simulation, traversing different fault regions, fault types, and fault levels, and obtaining detailed fault simulation information.

A specific embodiment of the invention is realized through the following method:

① dividing into m fault regions and setting n fault types according to the characteristics of the equipment to be monitored;

② initializing i=1, j=1;

③ setting the fault type to j, and letting i=1;
④ setting the fault region to i;
⑤ obtaining the equipment monitoring information at the time when the fault region is i and the fault type is j, and letting i=i+1;
⑥ determining the fault region: if all regions have not been traversed, i.e., i≤m, returning to ④; and
⑦ letting j=j+1, and determining the fault type: if all types have not been traversed, i.e., j≤n, returning to ③.

In steps S2 to S4, the method of obtaining monitoring information of the power equipment includes online monitoring, offline monitoring, and dynamic or static simulation analysis. When the fault of the region i and the type j is set, the severity of the fault is randomly determined according to the probability distribution of the fault level in actual operation of the equipment. The obtained data type may be a waveform (discrete time sampling sequence), an image, etc., which is uniformly processed as a matrix. In addition, for certain equipment in which it is difficult to set the fault or the probability of fault occurrence is extremely low, dynamic or static simulation results are used to replace the monitoring data and the historical detection records.

The network used for training in step S7 is a deep convolutional neural network and processes the monitoring information through image formation. The fault type and the fault position are combined together as a label. The monitoring fault type j and the fault region i are written in combination as "ji" which serves as the corresponding label $H_\gamma$, and the label in the normal state is written as "00", namely: $H_\gamma=\{00, 11, 12, \ldots ji\}$ ($\gamma=1, 2, \ldots, l$), where l is the total number of labels.

The detailed processing method of inputting the dataset to the network to be trained in step S7 is as follows: The time sequence of the waveform (discrete value monitoring data) is taken as the matrix column, the matrix row is filled with the same values to form a square matrix, and the monitoring amplitude is uniformly converted into color representation according to the color index and the square matrix is placed into the dataset to be trained; in the case of the image-type monitoring data, the color index is directly unified and then the monitoring data is placed as a monitoring image into the dataset to be trained. The image size of the dataset is unified, for example, as 224×224×3, and the dataset is taken as an input dataset of the deep convolutional neural network for training. In order to avoid the overfitting issue in the training process, operations (e.g., adding noise, cutting/transformation, rotation, mirroring, grayscale, etc.) are randomly performed on the monitoring image dataset to expand the dataset to be trained.

The method of performing fault diagnosis by using the trained convolutional neural network in step S8 is as follows: The feature map output by the last one pooling layer is taken as the input of the fully connected layer; and "(fault type n)×(fault position m)+2 (normal state, indeterminate state)" is replaced with the total output number of the fully connected layer (in the case of a few networks, e.g., SqueezeNet, in which the last one layer is a convolutional layer, it is replaced with a new convolutional layer, and the number of filters of the new convolutional layer is equal to the number of diagnostic label categories). A label "ji" of a different fault category means different fault type j and fault region i. By identifying the classification of the labels, the supports of each monitoring point information for different fault category labels is obtained.

The method of diagnosing information fusion of the multi-sensor monitoring system in step S10 includes: taking the supports of each monitoring point information for the different fault category labels after the fault diagnosis as the diagnosis result to be fused; and, through the multi-source information fusion method, fusing the support information of each monitoring point to obtain a final support for all the labels, i.e., a comprehensive diagnosis result.

The multi-source information fusion method of step S10 comes in many types, including, for example, a weighted average, methods based on the probability theory or the statistical model theory (Kalman filtering, Bayesian estimation, etc.), rule-based inference methods (the D-S evidence theory, the fuzzy set, the rough set, the expert system), etc. By fusing the diagnostic information of multiple monitoring points, the accuracy of the diagnosis can be further improved. Even if the diagnosis result according to the information of one single monitoring point is not ideal enough, the final accuracy can be significantly improved after fusion, which increases the application range of the diagnosis method.

In a specific embodiment of the invention, the evidence fusion diagnosis method of the sensor monitoring system includes the following steps:
① obtaining supports of each monitoring point $e_k$ (h is the total number of the monitoring points, i.e., k=1, 2, ..., h) for all labels $H_\gamma$: $\beta_{k,\gamma}=\beta_{k,1},\beta_{k,2}, \ldots, \beta_{k,l}$, (l is the total number of labels, i.e., $\gamma=1, 2, \ldots, l$);
② forming a support matrix with the monitoring point numeral as the row and the support for the label as the column, namely: $S(e_k)=\{(H_\gamma,\beta_{k,\gamma}), k=1, 2, \ldots, h, \gamma=1, \ldots, l\}$, where the probability assignment of estimating the attribute (i.e., the monitoring point here) $e_k$, which indicates the monitoring object to be evaluated, as the label $H_\gamma$ is $\beta_{k,\gamma}$;
③ determining the identification framework: treating each column in the support matrix as the identification framework of the DS evidence theory, namely, identification framework $\Theta=\{H_\gamma|\gamma=1, 2, \ldots, l\}=\{H_1, H_2, \ldots, H_l\}=\{00, 11, 12, \ldots, 21, \ldots, ji, \ldots, ym\}$;
④ classifying the information of different monitoring points $e_k$ into the same identification framework $\Theta$, and calculating the basic probability assignment (BPA):

$$m_{k,\gamma} = m_k(H_\gamma) = \omega_k \beta_{k,\gamma}$$

$$m_{k,H} = m_k(H) = 1 - \sum_{n=1}^{l} m_{k,\gamma} = 1 - \omega_k \sum_{n=1}^{l} \beta_{k,\gamma}$$

$$\tilde{m}_{k,H} = \tilde{m}_k(H) = \omega_k \left(1 - \sum_{n=1}^{l} \beta_{k,\gamma}\right)$$

$$\bar{m}_{k,H} = \bar{m}_k(H) = (1 - \omega_k)$$

where $\omega_k$ is the weight value of each monitoring point $e_k$, and, under normal circumstances, the average value is taken $\omega_k=1/h$.
⑤ synthesizing the probability assignment:

$$\{H_\gamma\}:m_\gamma = K\left[\prod_{k=1}^{h}\left(m_{k,\gamma}+\bar{m}_{k,H}+\tilde{m}_{k,H}\right) - \prod_{k=1}^{h}\left(\bar{m}_{k,H}+\tilde{m}_{k,H}\right)\right]$$

$$\{H\}:\tilde{m}_H = K\left[\prod_{k=1}^{h}\left(\bar{m}_{k,H}+\tilde{m}_{k,H}\right) - \prod_{k=1}^{h}\left(\bar{m}_{k,H}\right)\right]$$

$$\{H\}:\bar{m}_H = K\left[\prod_{k=1}^{h}\left(\bar{m}_{k,H}\right)\right]$$

-continued $$K = \left[\sum_{\gamma=1}^{l} \prod_{k=1}^{h} (m_{k,\gamma} + \overline{m}_{k,H} + \vec{m}_{k,H}) - (l-1)\prod_{k=1}^{h} (\overline{m}_{k,H} + \vec{m}_{k,H})\right]^{-1}$$

lastly, performing normalization processing to obtain a comprehensive diagnosis result:

$$\{H_\gamma\}: \beta_\gamma = \frac{m_\gamma}{1 - \overline{m}_H}, \gamma = 1, \ldots, l$$

$$\{H\}: \beta_\gamma = \frac{\vec{m}_H}{1 - \overline{m}_H}, \gamma = 1, \ldots, l.$$

Figure 2:
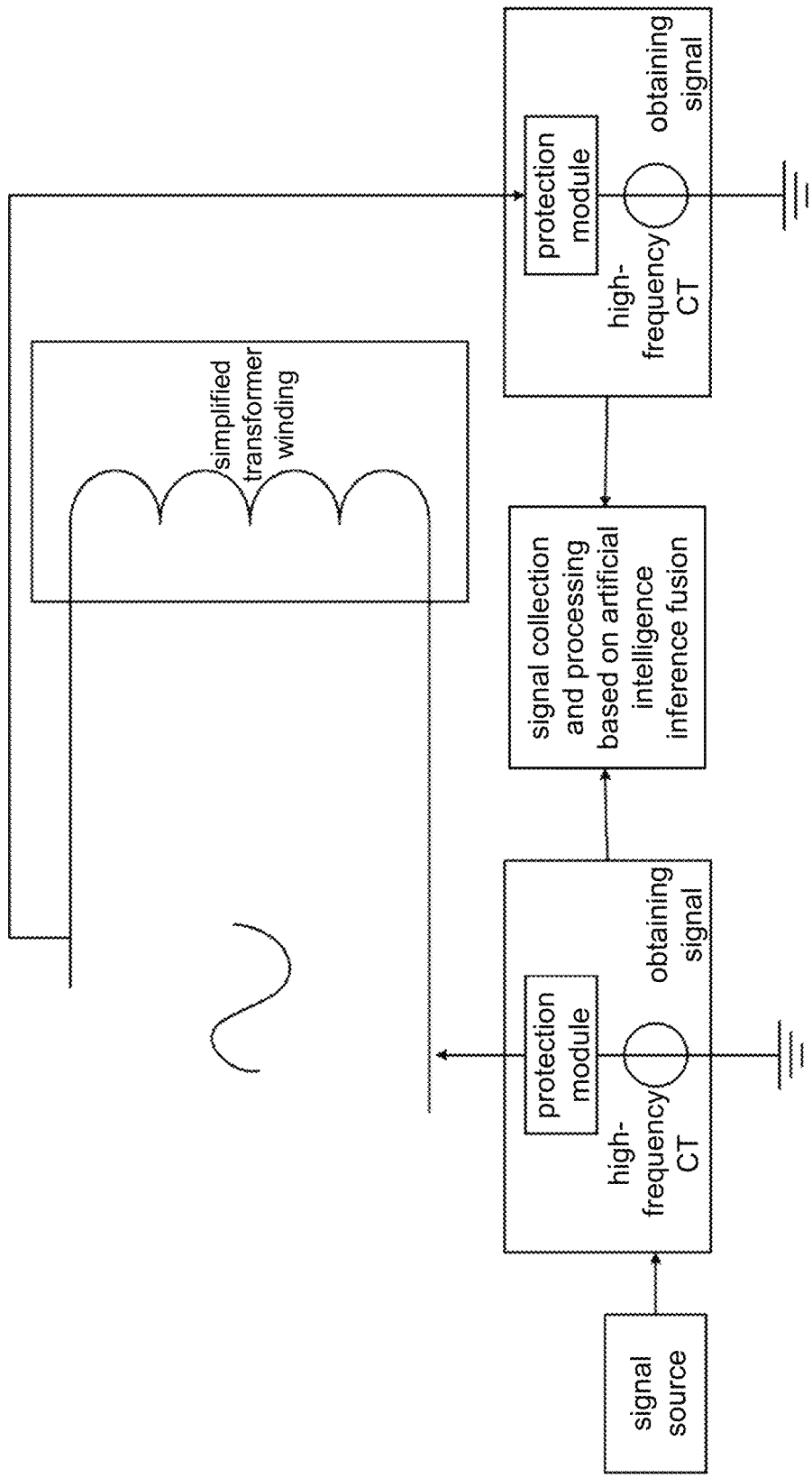
FIG. 2 shows an online detection principle of sweep frequency response of a transformer winding according to the invention.
Figure 3:
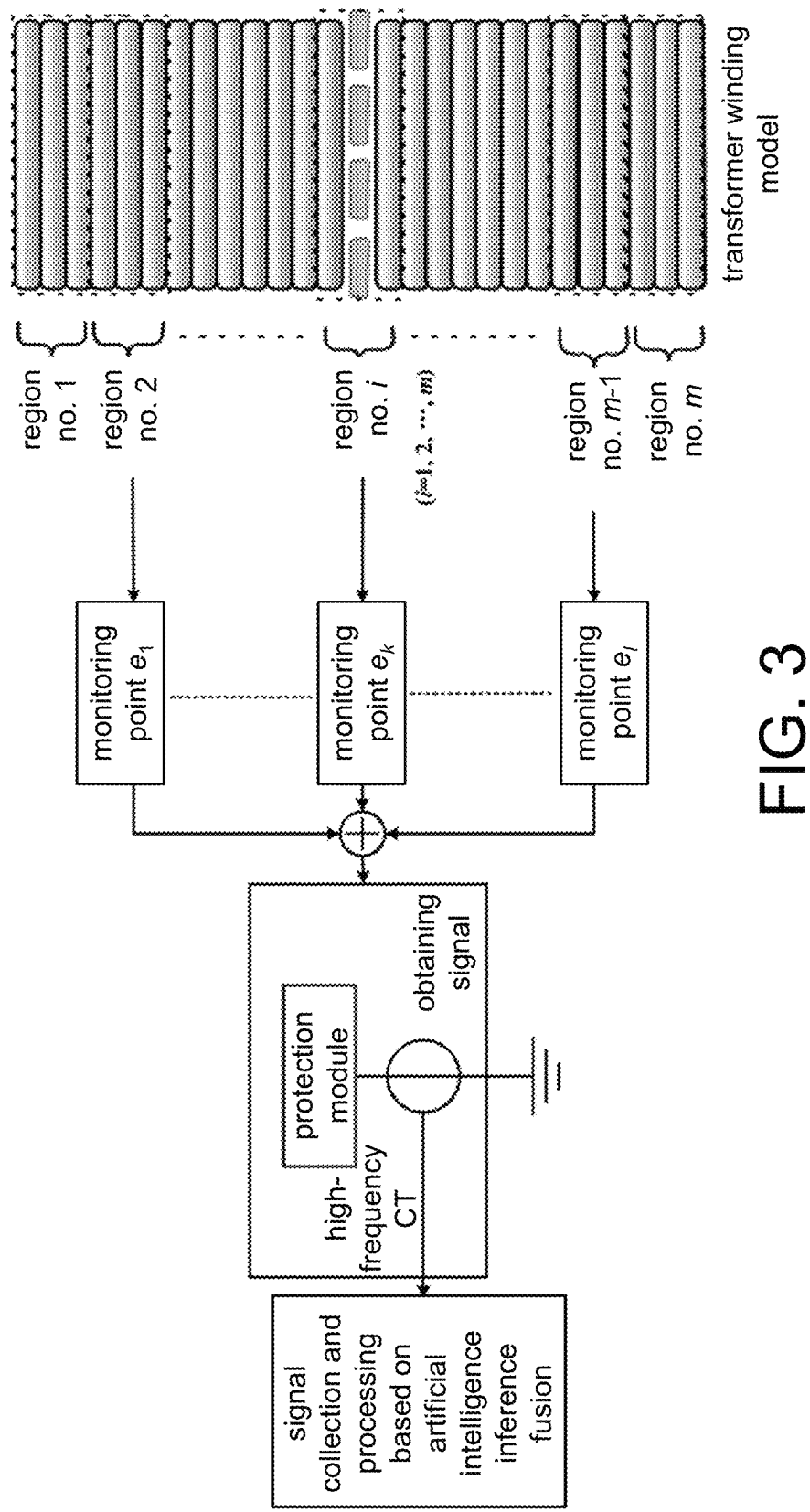
FIG. 3 shows a region division equivalent method and monitoring point positions of the transformer winding according to the invention.

The method of the invention is applied to fault diagnosis of deformation of a power transformer winding:

Monitoring data in the normal state is obtained by using the sweep frequency response monitoring method of a transformer winding shown in FIG. 2. Then, according to steps S2 to S4, a fault is set, and the equipment to be diagnosed is equally divided into m regions (m=7) (the division is as shown in FIG. 3). Sensor monitoring points are set at some positions therein (at $e_k$) to obtain monitoring information of different fault positions i (i=1, 2, ..., m) and different monitoring points $e_k$ (k=1, 2, ..., l) in the case of different fault types j (j=1, 2, ..., n) of the equipment. In the present embodiment, the monitoring point positions are respectively located at positions of k=2, 4, 6 (l=3). The following three fault types are set, namely n=3: change in the inter-disk pitch of the winding (which mainly affects the longitudinal capacitance value), shift of the winding axis (which mainly affects the longitudinal inductance value), and radial deformation of the winding (which affects the longitudinal capacitance, inductance, and capacitance to ground). With respect to different m types of fault regions, the severity of winding deformation is selected according to the random probability distribution, the test is conducted each for N=5 times, and each of the test results records transfer function $TF_{j\_i\_k\_N}$. The frequency response measurement result of each monitoring point is recorded as a training set 1, so the training set 1 of each monitoring point has (n×m+1)×N=(3×7+1)×5=110 samples in total, and the three monitoring points (k=2, 4, 6) have 330 samples in total. The more detailed the samples of the training set are, the more samples of setting the fault variations are, and the better the diagnostic effect is. In the actual test, the historical monitoring records may be taken as part of the fault dataset. For equipment in which it is difficult to set the fault or the fault causes a great loss upon occurrence, simulation data may be further used to supplement the insufficiency of the training dataset. The simulation data is taken as the rough training set to first train the bottom layer features of the network, and then the actually measured dataset is used for further fine-tuned training to optimally adjust the deep neural network.

In the present embodiment, the deep convolutional neural network is adopted to perform image classification on the monitoring information and realize fault identification and positioning by using the label information. Therefore, the monitoring fault type j and the fault region i are written in combination as "ji" which serves as the corresponding label $H_\gamma$. If the label in the normal state is written as "00", then: $H_\gamma = \{00, 11, 12, \ldots, ji\}$, ($\gamma=1, 2, \ldots, l$), where l is the total number of labels, and in the present embodiment, l=j×i+"00"=3×7+1=22. The time sequence obtained in steps S2 to S4 is taken as the matrix column, and the matrix row is filled with the same values to form a square matrix. The amplitude is uniformly converted into color representation according to the color index, and the size is unified, for example, as 224×224×3 according to the input requirements of the deep convolutional neural network and the square matrix is placed into the dataset 1 to be trained. In order to avoid overfitting, it is required to further perform image processing to expand the dataset. According to step S7, the following is performed: adding noise (Gaussian white noise of 0.05, 0.1, 0.15, 0.2, 0.3) to all the data of the dataset to be diagnosed, randomly cutting a region to be no less than ¼ of the original data length×5, randomly rotating angle×5, and then randomly selecting 10 from each of the label data to perform mirroring and grayscale operations, where the labels before and after image processing remain unchanged. Thus, each monitoring point obtains a dataset containing 110×(5+5+5)+22×10×2=2090 samples, and the total training datasets of each monitoring point are 2200. The total number of datasets of all the monitoring points is 6600.

Figure 4:
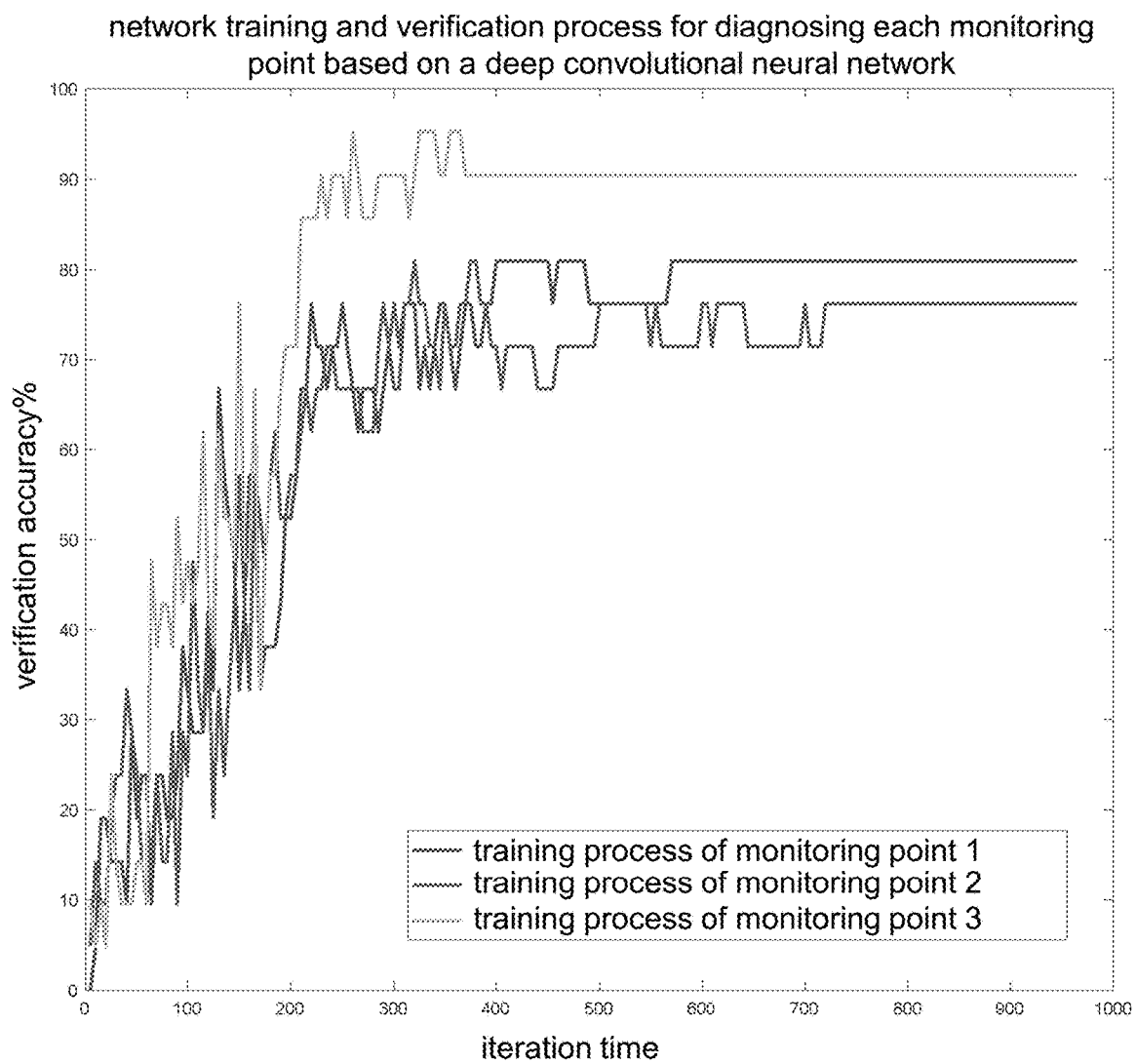
FIG. 4 shows a network training and verification process for diagnosing each monitoring point based on a deep convolutional neural network according to the invention.

According to step S8, in the present embodiment, the dataset features are identified and classified by using the improved GoogLeNet. (n fault types)×(m fault positions)+2 (normal state, indeterminate state) is modified to the total output number of the fully connected layer. The label "ji" of a different fault category means different fault type j and fault region i, and by identifying the classification of the labels, the type detection and positioning of the fault are realized. 80% of the data of each label γ of the dataset is randomly selected for performing network training, and the remaining 20% is used as the monitoring data to verify the classification result. The accuracy curves of the verification process are as shown in FIG. 4. It can be seen that as the number of training iterations increases, the accuracy of positioning continues to increase, and the final iteration ends at the $960^{th}$ time. The accuracy and loss value of the verification are respectively the following:

Monitoring point 1: accuracy=80.95%, loss=0.73;

Monitoring point 2: accuracy=76.19%, loss=0.81;

Monitoring point 3: accuracy=90.47%, loss=0.55.

Figure 5:
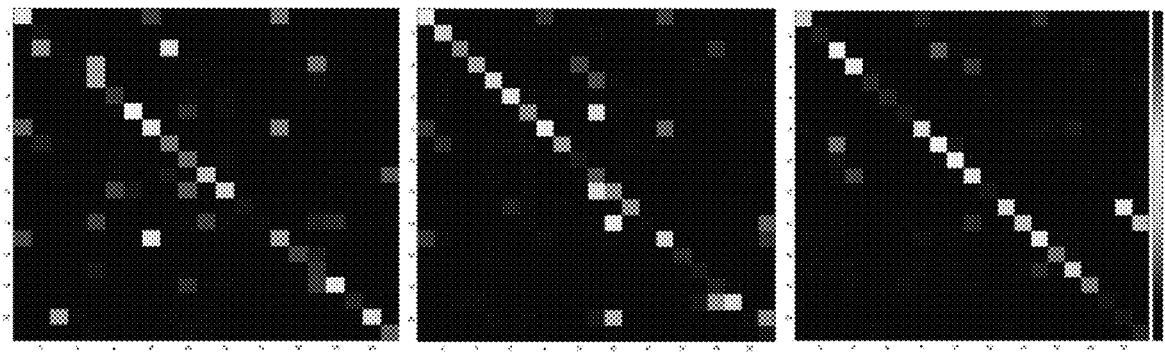
FIG. 5 shows a fault diagnosis support matrix of each monitoring point before inference fusion according to the invention.

In order to verify the validity of the inference fusion method, one sample, along with the support for its label classification, is randomly selected from the verification dataset of each label, and the samples are arranged in rows and the labels are taken as the columns to form a support matrix. Since tabular data would be a lot, images are illustrated here for the convenience of observation. The numerical value magnitudes are represented by colors, and the support matrices of monitoring point 1, monitoring point 2, and monitoring point 3 are as shown in FIG. 5. It can be seen from the figure that the accuracy of fault diagnosis at this time is not high enough, and the degree of discrimination of the diagnosis results is not large.

In the present embodiment, the DS evidence theory is adopted to perform multi-source information fusion. According to step S10 ④ and 5) ⑤, the fusion supports of all monitoring points are calculated, and the results are as shown in Table I. The numbers are rounded to integers here for the sake of brevity. The accuracies increase from the previous 80.95%, 76.19%, and 90.47% to 95.24%.

TABLE I

Results of verification of fault identification and positioning of monitoring data after inference fusion

| | Probability Assignment | | | | | | | | | | | |
|---|---|---|---|---|---|---|---|---|---|---|---|---|
| Label | 11 | 12 | 13 | 14 | 15 | 16 | 17 | 21 | 22 | 23 | 24 | 25 |
| 11 | 100% | 0% | 0% | 0% | 0% | 0% | 0% | 0% | 0% | 0% | 0% | 0% |
| 12 | 0% | 100% | 0% | 0% | 0% | 0% | 0% | 0% | 0% | 0% | 0% | 0% |
| 13 | 0% | 0% | 100% | 0% | 0% | 0% | 0% | 0% | 0% | 0% | 0% | 0% |
| 14 | 0% | 0% | 0% | 66% | 0% | 0% | 0% | 0% | 0% | 0% | 0% | 0% |
| 15 | 0% | 0% | 0% | 0% | 100% | 0% | 0% | 0% | 0% | 0% | 0% | 0% |
| 16 | 0% | 0% | 0% | 0% | 0% | 100% | 0% | 0% | 0% | 0% | 0% | 0% |
| 17 | 0% | 0% | 0% | 0% | 0% | 0% | 100% | 0% | 0% | 0% | 0% | 0% |
| 21 | 0% | 0% | 0% | 0% | 0% | 0% | 0% | 98% | 0% | 0% | 0% | 0% |
| 22 | 0% | 0% | 0% | 0% | 0% | 0% | 0% | 0% | 100% | 0% | 0% | 0% |
| 23 | 0% | 0% | 0% | 0% | 0% | 0% | 0% | 0% | 0% | 100% | 0% | 0% |
| 24 | 0% | 0% | 0% | 0% | 0% | 0% | 0% | 0% | 0% | 0% | 100% | 0% |
| 25 | 0% | 0% | 0% | 0% | 0% | 0% | 0% | 0% | 0% | 0% | 0% | 100% |
| 26 | 0% | 0% | 0% | 0% | 0% | 0% | 0% | 0% | 0% | 0% | 0% | 0% |
| 27 | 0% | 0% | 0% | 0% | 0% | 0% | 0% | 0% | 0% | 0% | 17% | 0% |
| 31 | 0% | 0% | 0% | 0% | 0% | 0% | 0% | 1% | 0% | 0% | 0% | 0% |
| 32 | 0% | 0% | 0% | 0% | 0% | 0% | 0% | 0% | 0% | 0% | 0% | 0% |
| 33 | 0% | 0% | 0% | 0% | 0% | 0% | 0% | 0% | 0% | 0% | 0% | 0% |
| 34 | 0% | 0% | 0% | 0% | 0% | 0% | 0% | 0% | 0% | 0% | 0% | 0% |
| 35 | 0% | 0% | 0% | 0% | 0% | 0% | 0% | 0% | 0% | 0% | 0% | 0% |
| 36 | 0% | 0% | 0% | 0% | 0% | 0% | 0% | 0% | 0% | 0% | 0% | 0% |
| 37 | 0% | 0% | 0% | 0% | 0% | 0% | 0% | 0% | 0% | 0% | 0% | 0% |

| | Probability Assignment | | | | | | | | | |
|---|---|---|---|---|---|---|---|---|---|---|
| Label | 26 | 27 | 31 | 32 | 33 | 34 | 35 | 36 | 37 | Indeterminacy |
| 11 | 0% | 0% | 0% | 0% | 0% | 0% | 0% | 0% | 0% | 0% |
| 12 | 0% | 0% | 0% | 0% | 0% | 0% | 0% | 0% | 0% | 0% |
| 13 | 0% | 0% | 0% | 0% | 0% | 0% | 0% | 0% | 0% | 0% |
| 14 | 0% | 0% | 0% | 0% | 0% | 0% | 0% | 0% | 0% | 34% |
| 15 | 0% | 0% | 0% | 0% | 0% | 0% | 0% | 0% | 0% | 0% |
| 16 | 0% | 0% | 0% | 0% | 0% | 0% | 0% | 0% | 0% | 0% |
| 17 | 0% | 0% | 0% | 0% | 0% | 0% | 0% | 0% | 0% | 0% |
| 21 | 0% | 0% | 1% | 0% | 0% | 0% | 0% | 0% | 0% | 0% |
| 22 | 0% | 0% | 0% | 0% | 0% | 0% | 0% | 0% | 0% | 0% |
| 23 | 0% | 0% | 0% | 0% | 0% | 0% | 0% | 0% | 0% | 0% |
| 24 | 0% | 0% | 0% | 0% | 0% | 0% | 0% | 0% | 0% | 0% |
| 25 | 0% | 0% | 0% | 0% | 0% | 0% | 0% | 0% | 0% | 0% |
| 26 | 100% | 0% | 0% | 0% | 0% | 0% | 0% | 0% | 0% | 0% |
| 27 | 0% | 29% | 0% | 0% | 0% | 0% | 0% | 0% | 55% | 0% |
| 31 | 0% | 0% | 99% | 0% | 0% | 0% | 0% | 0% | 0% | 0% |
| 32 | 0% | 0% | 0% | 100% | 0% | 0% | 0% | 0% | 0% | 0% |
| 33 | 0% | 0% | 0% | 0% | 100% | 0% | 0% | 0% | 0% | 0% |
| 34 | 0% | 0% | 0% | 0% | 0% | 100% | 0% | 0% | 0% | 0% |
| 35 | 0% | 0% | 0% | 0% | 0% | 0% | 100% | 0% | 0% | 0% |
| 36 | 0% | 0% | 0% | 0% | 0% | 0% | 0% | 100% | 0% | 0% |
| 37 | 0% | 0% | 0% | 0% | 0% | 0% | 0% | 0% | 100% | 0% |

By comparing the evidence support of each monitoring point before fusion in FIG. 5, it can be seen that the present solution can not only accurately provide the type of the fault and the position of the fault, but also increase the identifiability for the fault position and type.

The specific embodiments of the invention have been described in detail above and applied to the field of intelligent diagnosis of a fault in a transformer winding. It should be noted that those skilled in the art may make various improvements and modifications to the invention without departing from the basic principles of the invention, and such improvements and modifications also fall within the claimed protection scope of the invention.

What is claimed is:

1. A power equipment fault detecting and positioning method of artificial intelligence inference fusion, comprising steps of:

1) setting state detection points of power equipment and obtaining monitoring data of different monitoring points of the power equipment;

2) setting fault types, fault positions, and fault severities of the power equipment, and obtaining monitoring information of the different monitoring points, fault levels of the fault severities being set according to a fault severity distribution of actual application with respect to a same fault region and fault type;

3) taking the obtained monitoring information as a training dataset and taking the fault types and the fault positions as labels, and inputting the training dataset and the labels to a deep convolutional neural network for training to obtain a trained power equipment fault detecting neural network;

4) performing verification and classification by using the power equipment fault detecting neural network, and obtaining supports corresponding to each of the labels; and 5) taking the supports corresponding to different labels as basic probability assignment values and taking different sensors as different evidences for decision fusion, and performing fusion processing by using a multi-source information fusion method to obtain a final fault diagnosis result.

2. The power equipment fault detecting and positioning method of artificial intelligence inference fusion according to claim 1, wherein step 2) specifically comprises steps of: first, dividing fault regions according to characteristics of equipment to be monitored and setting the fault types and the fault positions; and then, performing cyclic simulation, traversing different fault regions, fault types, and the fault levels, and obtaining detailed fault simulation information.

3. The power equipment fault detecting and positioning method of artificial intelligence inference fusion according to claim 1, wherein in steps 1) to 2), a method of obtaining the monitoring information of the power equipment comprises online monitoring, offline monitoring, and dynamic or static simulation analysis,
when a fault of a fault region i and a fault type j is set, the fault severity is randomly determined according to a probability distribution of the fault level in actual operation of the equipment, and
for certain equipment in which it is difficult to set the fault or a probability of fault occurrence is extremely low, dynamic or static simulation results are used to replace the monitoring data and historical detection records.

4. The power equipment fault detecting and positioning method of artificial intelligence inference fusion according to claim 1, wherein the network used for training in step 3) is a deep convolutional neural network and processes the monitoring information through image formation, wherein monitoring fault type j and fault region i are written in combination as "ji" which serves as a corresponding label $H\gamma$, and the label in the normal state is written as "00": $H_\gamma=\{00, 11, 12, \ldots, ji\}$, $\gamma=1, 2, \ldots, l$, where l is a total number of the labels,
a time sequence of discrete value monitoring data is taken as a matrix column, and a matrix row is filled with the same values to form a square matrix, and a monitoring amplitude is uniformly converted into color representation according to a color index and the square matrix is placed into a dataset to be trained,
in the case of image-type monitoring data, the color index is directly unified and then the monitoring data is placed as a monitoring image into the dataset to be trained, and
an image size of the dataset is unified, and the dataset is taken as an input dataset of the deep convolutional neural network for training.

5. The power equipment fault detecting and positioning method of artificial intelligence inference fusion according to claim 4, wherein operations of adding noise, cutting/transformation, rotation, mirroring, grayscale, etc. are randomly performed on a monitoring image dataset to expand the dataset to be trained.

6. The power equipment fault detecting and positioning method of artificial intelligence inference fusion according to claim 4, wherein in a method of performing fault diagnosis by using the convolutional neural network in step 3):
a feature map output by a last one pooling layer is taken as an input of a fully connected layer,
"(fault type n)×(fault position m)+2 (normal state, indeterminate state)" is replaced with a total output number of the fully connected layer, and
the label "ji" of a different fault category means different fault type j and fault region i, and by identifying a classification of the labels, preliminary type detection and positioning of the fault is realized.

7. The power equipment fault detecting and positioning method of artificial intelligence inference fusion according to claim 1, wherein label supports obtained in step 4) are probability values of an input dataset belonging to the different labels and are classified and obtained by the trained network.

8. The power equipment fault detecting and positioning method of artificial intelligence inference fusion according to claim 1, wherein an information fusion diagnosis method of a multi-sensor monitoring system in step 5) comprises: obtaining supports of each of the monitoring points for all of the labels based on an output result of performing fault diagnosis by the CNN; and fusing support information of each of the monitoring points through the multi-source information fusion method to obtain a final support for the labels.

9. The power equipment fault detecting and positioning method of artificial intelligence inference fusion according to claim 1, wherein the multi-source information fusion method in step 5) comprises: a weighted average, a method based on a probability theory or a statistical model theory, and a rule-based inference method.

* * * * *